(12) United States Patent
Yoo et al.

(10) Patent No.: US 7,985,646 B2
(45) Date of Patent: Jul. 26, 2011

(54) METHOD OF FABRICATING NANOWIRE MEMORY DEVICE AND SYSTEM OF CONTROLLING NANOWIRE FORMATION USED IN THE SAME

(75) Inventors: Jin-gyoo Yoo, Yongin-si (KR);
Cheol-soon Kim, Yongin-si (KR);
Jung-hoon Lee, Seoul (KR)

(73) Assignees: Samsung Electronics Co., Ltd., Suwon-si (KR); Seoul National University Industry Foundation, Seoul (KR)

( * ) Notice: Subject to any disclaimer, the term of this patent is extended or adjusted under 35 U.S.C. 154(b) by 1180 days.

(21) Appl. No.: 11/712,990

(22) Filed: Mar. 2, 2007

(65) Prior Publication Data

US 2007/0231988 A1 Oct. 4, 2007

(30) Foreign Application Priority Data

Mar. 9, 2006 (KR) .................. 10-2006-0022322

(51) Int. Cl.
*G11C 11/50* (2006.01)
(52) U.S. Cl. .............. 438/257; 365/151; 257/E51.039
(58) Field of Classification Search .............. 438/53; 977/732; 257/107, 393, 444
See application file for complete search history.

(56) References Cited

U.S. PATENT DOCUMENTS

| | | | |
|---|---|---|---|
| 6,719,602 B2 * | 4/2004 | Nakayama et al. | 445/50 |
| 6,874,668 B2 * | 4/2005 | Cumings et al. | 225/3 |
| 7,256,063 B2 * | 8/2007 | Pinkerton et al. | 438/53 |
| 7,382,648 B2 * | 6/2008 | Bockrath | 365/164 |
| 7,405,420 B1 * | 7/2008 | Wong et al. | 257/4 |
| 2007/0268739 A1 * | 11/2007 | Yoo et al. | 365/151 |

* cited by examiner

*Primary Examiner* — Steven Loke
*Assistant Examiner* — David Goodwin
(74) *Attorney, Agent, or Firm* — Sughrue Mion, PLLC

(57) ABSTRACT

A method of fabricating a nanowire memory device, and a system of controlling nanowire formation used in the same method are provided. In the method of fabricating a nanowire memory device which includes a substrate; an electrode formed on the substrate and insulated from the substrate; and a nanowire having its one end connected with the electrode and formed at a given length, the method comprises: forming an electrode and a dummy electrode to be paired with the electrode on the substrate; forming the nanowire between the electrode and the dummy electrode while measuring a current flowing between the electrode and the dummy electrode, and cutting power applied between the electrode and the dummy electrode when the current measured is a given value; and removing the dummy electrode.

9 Claims, 3 Drawing Sheets

METHOD OF FABRICATING NANOWIRE MEMORY DEVICE AND SYSTEM OF CONTROLLING NANOWIRE FORMATION USED IN THE SAME

CROSS-REFERENCE TO RELATED PATENT APPLICATIONS

This application claims priority from Korean Patent Application No. 10-2006-0022322, filed on Mar. 9, 2006, in the Korean Intellectual Property Office, the disclosure of which is incorporated herein in its entirety by reference.

BACKGROUND OF THE INVENTION

1. Field of the Invention

A method consistent with the present invention relates to a method of fabricating a semiconductor memory device and, more particularly, to a method of fabricating a memory device including a nanowire as a storage node and a system of controlling nanowire formation used in the same method.

2. Description of the Related Art

Most of the recently introduced memory devices combine the advantages of existing volatile memory devices and those of existing non-volatile memory devices, for example, a ferroelectric RAM (FRAM), a magnetic RAM (MRAM), a phase change RAM (PRAM), or a resistive RAM (RRAM). The advanced memory devices such as the FRAM, MRAM, PRAM, and RRAM are different from one another in terms of the constitution of a storage node.

As another example of the advanced memory devices, a memory device using a carbon nanotube has been introduced. The carbon nanotube memory device uses a carbon nanotube as a storage node.

The carbon nanotube memory device has the advantage of reducing the volume of the storage node, compared to the FRAM, MRAM, PRAM, or RRAM. In the carbon nanotube memory device, since the carbon nanotube is formed by using a composite electric field, it is possible to form the carbon nanotube at an accurate position.

However, in a method of fabricating the carbon nanotube memory device which has been introduced up to now, there may occur an occasion that two or more carbon nanotubes are formed between electrodes forming one cell, thereby decreasing an effective operation yield of the memory device.

SUMMARY OF THE INVENTION

Exemplary embodiments consistent with the present invention provide a method of fabricating a nanowire memory device which is capable of increasing an effective operation yield.

The present invention also provides a system of controlling nanowire formation used in the method of fabricating a nanowire memory device.

According to an aspect of the invention, there is provided a method of fabricating a nanowire memory device which includes a substrate; an electrode formed on the substrate and insulated from the substrate; and a nanowire having its one end connected with the electrode and formed at a given length, the method comprising: forming an electrode and a dummy electrode to be paired with the electrode on the substrate; forming the nanowire between the electrode and the dummy electrode while measuring a current flowing between the electrode and the dummy electrode, and cutting power applied between the electrode and the dummy electrode when the current measured is a given value; and removing the dummy electrode.

According to another aspect of the present invention, there is provided a method of fabricating a nanowire memory device which includes a substrate; two pairs of electrodes formed on the substrate, insulated from the substrate and spaced apart from each other, a nanowire connecting two electrodes of each pair, the method comprising: forming, on the substrate, two electrodes of a first pair spaced apart from each other, and two electrodes of a second pair spaced apart from each other, and spaced apart from the first pair of electrodes; and forming the nanowire between two electrodes of each pair while measuring a current flowing between the two electrodes of each pair, and cutting power applied between the two electrodes of each pair when the current measured is a given value.

In the method, at least one more first pair of electrodes, at least one more second pair of electrodes, and at least one more nanowire for connecting two electrodes in each pair may be formed.

The nanowire may be formed using a composite electric field, and the measuring of the current and the cutting of the power may be performed using a system including a switching logic and a current monitor. The system may be a complementary metal-oxide semiconductor (CMOS) logic.

According to another aspect of the present invention, there is provided a system of controlling nanowire formation used in a method of fabricating a nanowire memory device which includes electrodes spaced apart from one another; and a nanowire for connecting two electrodes of each pair, among the electrodes, the system comprising: a function generator which generates a composite electric field between two electrodes to be paired; a current monitor which measures a current flowing between the two electrodes while the nanowire is formed, and sends an operation signal when the current measured is a given value; and a switching logic which cuts power applied between the two electrodes when the operation signal is given from the current monitor.

According to another aspect of the present invention, there is provided a system of controlling nanowire formation used in a method of fabricating a nanowire memory device, in which the method comprises: forming an electrode and a dummy electrode of the electrode on a substrate; forming a nanowire between the electrode and the dummy electrode; and removing the dummy electrode, the system comprising: a function generator which generates a composite electric field between the electrode and the dummy electrode; a current monitor which measures a current flowing between the electrode and the dummy electrode while the nanowire is formed, and sends an operation signal when the measured current is a given value; and a switching logic which cuts power applied between the electrode and the dummy electrode when the operation signal is given from the current monitor.

The systems may be a CMOS logic including the function generator, current monitor and switching logic.

According to another aspect of the present invention, there is provided a system of controlling nanowire formation used in a method of fabricating a nanowire memory device which includes electrodes spaced apart from one another, and a nanowire connecting two electrodes to be paired among the electrodes, the system comprising: means for generating a composite electric field between the two electrodes to be paired, a current monitor which measures a current flowing between the two electrodes while the nanowire is formed, and sends an operation signal when the current measured is a given value; and a switching logic which cuts power applied between the two electrodes when the operation signal is given from the current monitor.

In accordance with the present invention, the effective operation yield, i.e., the yield of an operable memory cell is increased.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF EXEMPLARY EMBODIMENTS OF THE INVENTION

Figure 1:
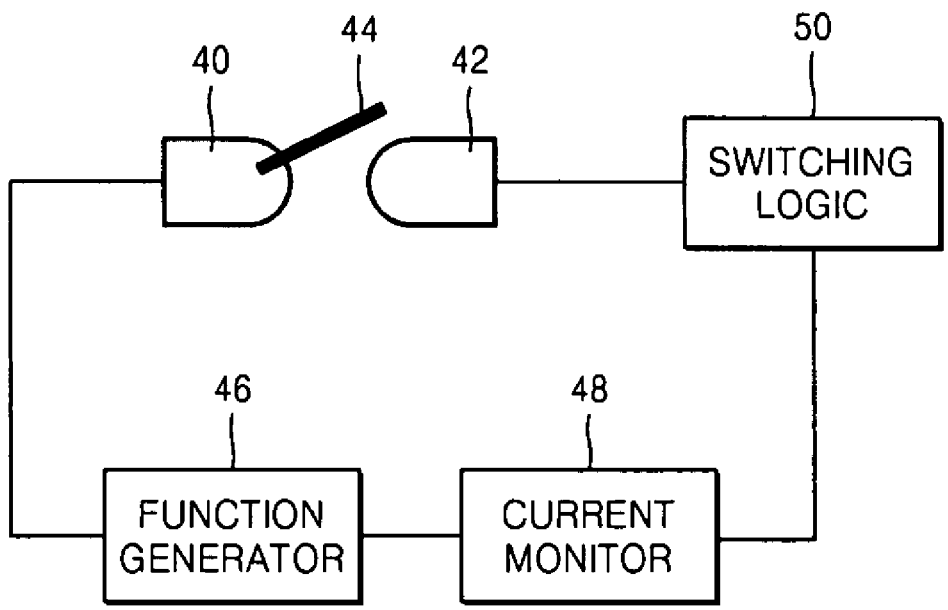
FIG. 1 is a block diagram illustrating constitution of a system for monitoring whether a nanowire is formed between electrodes, in a method of fabricating a nanowire memory device according to an exemplary embodiment of the present invention.

A method of fabricating a nanowire memory device (hereinafter, referred to as the 'fabrication method') and a system of controlling nanowire formation used in the fabrication method (hereinafter, referred to as the 'system') according to exemplary embodiments of the present invention will now be described more fully hereinafter with reference to the accompanying drawing.

In the drawings, the thickness of layers and regions is exaggerated for clarity.

The description of the system will not be separately presented but will be presented along with the description of the fabrication method according to the present exemplary embodiment.

The fabrication method according to the present exemplary embodiment comprises: forming electrodes spaced apart from each other, on a substrate; forming a nanowire between the electrodes by using a composite electric field; monitoring and controlling the nanowire formation to form only one nanowire between the electrodes while the nanowire is formed.

FIG. 1 illustrates an exemplary constitution of the system for monitoring and controlling the nanowire formation.

Referring to FIG. 1, a function generator 46 applies power to first and second electrodes 40 and 42 formed on a substrate (not shown) and spaced apart from each other. A composite electric field is generated between the first and second electrodes 40 and 42, and a nanowire 44 is formed between the first and second electrodes 40 and 42. The nanowire 44 may be a carbon nanotube or it may take other forms such as a carbon nanowire. The first electrode 40 is directly connected with the function generator 46, and the second electrode 42 is connected with the function generator 46 through a switching logic 50 and a current monitor 48. When the nanowire 44 is formed between the first and second electrodes 40 and 42 and a current flowing between the first and second electrodes 40 and 42 suddenly increases, the switching logic 50 directly connected with the second electrode 42 cuts power supplied from the function generator 46 to the first and second electrodes 40 and 42. When the nanowire 44 is formed between the first and second electrodes 40 and 42 and the current flowing between the first and second electrodes 40 and 42 suddenly increases, the current monitor 48 positioned between the function generator 46 and the switching logic 50 detects a point in time of the sudden increase of the current and sends a signal to the switching logic 50. The switching logic 50 receiving the signal from the current monitor 48 cuts the power supplied to the first and second electrodes 40 and 42. The system, i.e., the power supplied to the first and second electrodes 40 and 42, the current monitor 48 and the switching logic 50, is constituted by using a CMOS circuit. Then, the power is independently supplied to the first electrode 40 and the second electrode 42. When a single nanowire 44 connecting the first electrode 40 with the second electrode 42 is formed between the first and second electrodes 40 and 42, it is possible to cut the power immediately, thereby preventing the formation of any other nanowires than the single nanowire 44 initially formed between the first and second electrodes 40 and 42, or any foreign materials.

Figure 2:
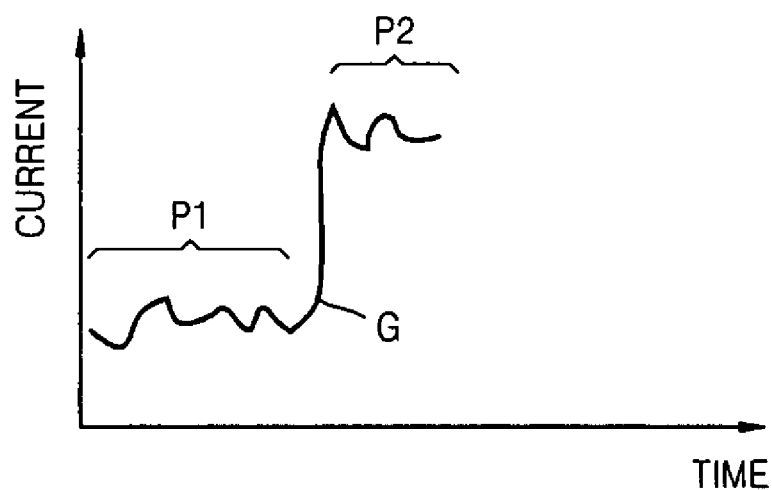
FIG. 2 is a graph illustrating a change of the current-time characteristics before and after the nanowire is formed between the electrodes, in the method of fabricating a nanowire memory device according to the exemplary embodiment of the present invention.

In FIG. 2, the graph G illustrates a change of the current flowing between the first and second electrodes 40 and 42 with the passage of time, before and after the nanowire 44 is formed between the first and second electrodes 40 and 42.

In the graph G, a first period P1 represents the current flowing between the first and second electrodes 40 and 42 before these electrodes 40 and 42 are connected by the nanowire 44, and a second period P2 represents the current flowing between the first and second electrodes 40 and 42 after these electrodes 40 and 42 are connected by the nanowire 44 and before the power is cut.

Referring to the graph G of FIG. 2, it is known that a change of the current is sudden between the first and second periods P1 and P2. The sudden change results from the connection of the first and second electrodes 40 and 42 by the nanowire 44. The current monitor 48 detects the change of the current and informs the switching logic 50 thereof. Thus, there is no current flowing between the first and second electrodes 40 and 42 after the second period P2.

Figure 3:
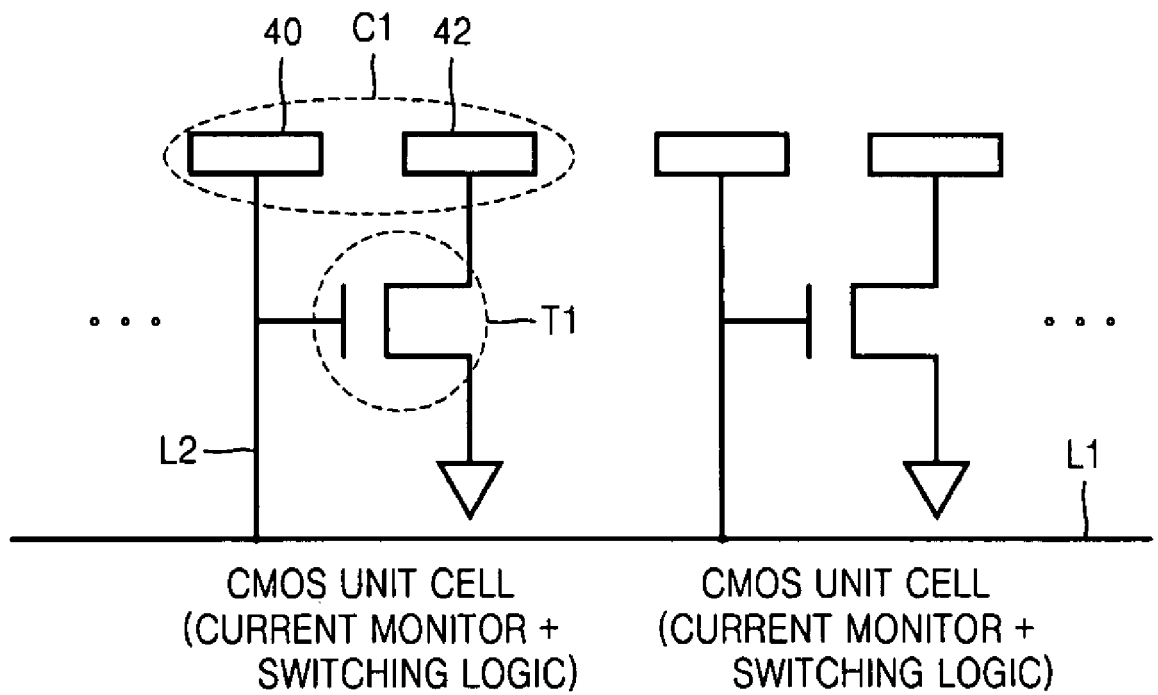
FIG. 3 illustrates a logic for forming a nanowire in a plurality of memory cells by using CMOS unit cells including a current monitor and a switching logic, as a system of controlling nanowire formation.

FIG. 3 illustrates a logic used the operation of the system, to form a nanowire in a plurality of memory cells by using a CMOS unit cell including a current monitor and a switching logic.

Referring to FIG. 3, power is applied from a function generator to each memory cell C1 through a power bus L1. The power bus L1 is connected, in common, with a first electrode 40 of each memory cell C1. The power bus L1 is connected, in common, with a gate of each transistor T1 corresponding to each memory cell C1. The number of transistors is same as that of memory cells. When the power is supplied to the first electrode 40 through the power bus L1, the transistor is ON. A source of the transistor T1 is connected with the second electrode 42, and a drain thereof is grounded. In each memory cell C1, a CMOS unit cell is assigned between the first and second electrodes 40 and 42. The CMOS unit cell includes the current monitor and the switching logic which control the formation of the nanowire such that only a single nanowire is formed between the first and second electrodes 40 and 42. The CMOS unit cell may be positioned between a line L2 branched off from the power bus L1 to each memory cell C1 and the drain of the transistor T1. Accordingly, the nanowire can be independently formed between the first and second electrodes 40 and 42 of each memory cell C1 by the CMOS unit cell. When only the single nanowire is initially formed between the first and second electrodes 40 and 42, it is possible to independently cut the power supplied to each memory cell C1. The CMOS unit cell may further include a storing and reading logic used for storing and reading data in the memory cell C1.

The design, manufacture and mass production of the logic as shown in FIG. 3 are possible by using a semiconductor process.

Figure 4:
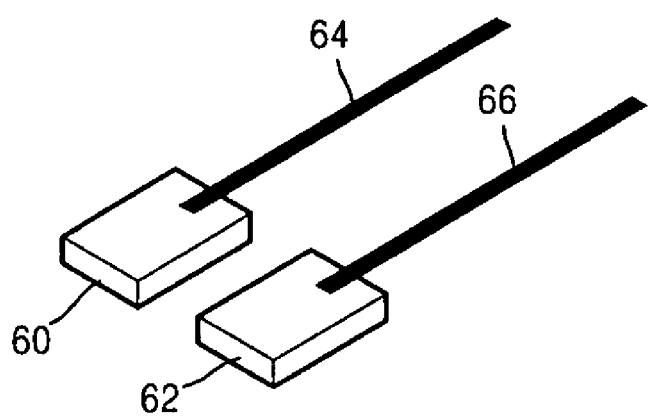
FIGS. 4 through 6 are perspective views illustrating examples of a nanowire memory device to which the method of fabricating a nanowire memory device according to the exemplary embodiment of the present invention is applicable.
Figure 5:
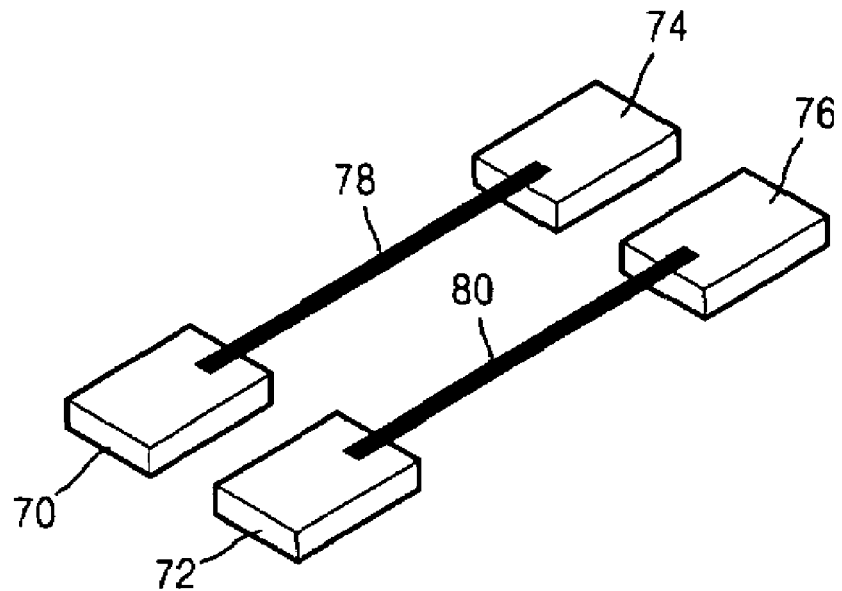
Figure 6:
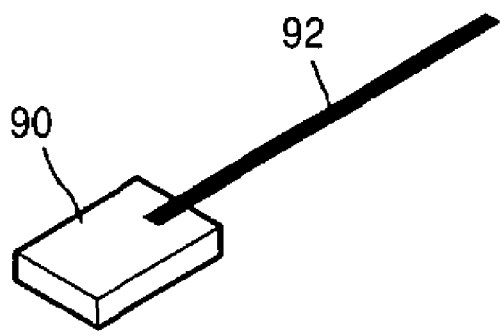

Nanowire memory devices formed by the fabrication method according to the present exemplary embodiment may vary as shown, for example, in FIGS. 4 through 6.

A nanowire memory device of FIG. 4 includes first and second electrodes 60 and 62 formed on a substrate (not shown) and spaced apart from each other. A first nanowire 64 formed by using a composite electric field is positioned, with a given length, on the first electrode 60. A second nanowire 66 formed by using the composite electric field is positioned, with a given length, on the second electrode 62. The first and second nanowires 64 and 66 are formed to be parallel to each other. The first and second nanowires 64 and 66 may be, for example, carbon nanotubes or carbon nanowires, and have the same length. The first and second nanowires 64 and 66 are used as a storage node where data 0 or 1 is stored. When the ends of the first and second nanowires 64 and 66 come into contact with each other, i.e., when the resistance between the first and second electrodes 64 and 66 becomes low, it is considered that data 1 (or 0) is recorded in the memory device. However, when the ends of the first and second nanowires 64 and 66 are separated from each other as illustrated in FIG. 4, i.e., when the resistance between the first and second electrodes 64 and 66 becomes high, it is considered that data 0 (or 1) is recorded in the memory device.

In a method of fabricating the memory device as illustrated in FIG. 4, a first dummy electrode (not shown) corresponding to the first electrode 60 and a second dummy electrode (not shown) corresponding to the second electrode 62 are formed on the substrate corresponding to the ends of the first and second nanowires 64 and 66. Then, the first nanowire 64 is formed between the first electrode 60 and the first dummy electrode, and the second nanowire 66 is formed between the second electrode 62 and the second dummy electrode. The first and second dummy electrodes are removed during a process of cutting the first and second nanowires 64 and 66 at the same regular length.

The above-described nanowire formation system is applied during the process of forming the first and second nanowires 64 and 66, thereby forming only a single first nanowire 64 on the first electrode 60 and only a single second nanowire 66 on the second electrode 62.

A nanowire memory device as illustrated in FIG. 5 includes first and second electrodes 70 and 72 formed on a substrate (not shown) and spaced apart from each other; and third and fourth electrodes 74 and 76 formed on the substrate and spaced apart from each other. The third electrode 74 is paired with the first electrode 70, and the fourth electrode 76 is paired with the second electrode 72. The third and fourth electrodes 74 and 76 are spaced apart from each other at the same interval as that of the first and second electrodes 70 and 72.

The first to fourth electrodes 70, 72, 74 and 76 are positioned as shown in FIG. 5. A first nanowire 78 is formed between the first and third electrodes 70 and 74, and a second nanowire 80 is formed between the second and fourth electrodes 72 and 76. The first and second nanowires 78 and 80 are formed by using a composite electric field. Only a single first nanowire 78 is formed between the first and third electrodes 70 and 74, and only a single second nanowire 80 is formed between the second and fourth electrodes 72 and 76, by using the system including the function generator 46, the current monitor 48 and the switching logic 50 as described with reference to FIG. 1.

In the memory device of FIG. 5, the first and second nanowires 78 and 80 are used as a storage node. When the first and second nanowires 78 and 80 are separated from each other as shown, it is considered that data 0 (or 1) is recorded in the memory device. When the first and second nanowires 78 and 80 come into contact with each other at their middle portions, it is considered that data 1 (or 0) is recorded in the memory device.

A memory device as illustrated in FIG. 6 includes a substrate (not shown); a first electrode 90 formed on the substrate and insulated from the substrate; and a nanowire 92 formed at a given length. One end of the nanowire 92 is connected with the first electrode 90. The nanowire 92 is formed to be parallel to the substrate. The nanowire 92 is used as a storage node, together with the substrate. Thus, depending on whether the other end of the nanowire 92 contacts with the substrate, it is considered that data 0 or 1 is recorded in the memory device.

In a method of fabricating the memory device of FIG. 6, before the nanowire 92 is formed, a dummy electrode (not shown) to be paired with the first electrode 90 is formed on a desired region of the substrate corresponding to the other end of the nanowire 92. Then, the nanowire 92 is formed between the first electrode 90 and the dummy electrode. The nanowire 92 is formed by using a composite electric field. During a process of cutting the nanowire 92 at a regular length, the dummy electrode is removed.

During the process of forming the nanowire 92, the system is applied such that only a single nanowire 92 is formed between the first electrode 90 and the dummy electrode.

As described above, the method of fabricating a nanowire memory device according to the present embodiment uses the system including the function generator for generating the composite electric field, the current monitor and the switching logic, during the process of forming the nanowire by using the composite electric field, thereby forming only the single nanowire between the electrodes to be paired. Thus, the present invention is used to form the nanowire at an accurate position and to increase the effective operation yield of the memory device, i.e., the yield of the memory cells which are operable in accordance with predetermined operation conditions or standard operation conditions.

While the present invention has been particularly shown and described with reference to an exemplary embodiment thereof, it should not be construed as being limited to the embodiment set forth, and it will be understood by those of ordinary skill in the art that various changes in form and details may be made. For example, a skilled person in the art may apply the above-described system to a method of fabricating a memory device having any other constitution if it uses a nanowire as a storage node, in addition to the memory devices illustrated in FIGS. 4 through 6. Thus, the spirit and scope of the present invention shall not be limited by the exemplary embodiments and shall be defined by the following claims.

What is claimed is:

1. A method of fabricating a nanowire memory device which includes a substrate; an electrode formed on the substrate and insulated from the substrate; and a nanowire having its one end connected with the electrode and formed at a given length, the method comprising:

forming an electrode and a dummy electrode to be paired with the electrode on the substrate;

forming the nanowire between the electrode and the dummy electrode while measuring a current flowing between the electrode and the dummy electrode, and cutting power applied between the electrode and the dummy electrode when the current measured is a given value; and removing the dummy electrode.

2. The method of claim 1, wherein at least one more electrode and at least one more nanowire are formed.

3. The method of claim 1, wherein the nanowire is formed by a composite electric field, and the measuring of the current and the cutting of the power are performed by a system including a switching logic and a current monitor.

4. The method of claim 3, wherein the system is a complementary metal-oxide semiconductor (CMOS) logic.

5. A method of fabricating a nanowire memory device which includes a substrate; two pairs of electrodes formed on the substrate, insulated from the substrate and spaced apart from each other; a nanowire connecting two electrodes of each pair, the method comprising:

forming, on the substrate, two electrodes of a first pair spaced apart from each other, and two electrodes of a second pair spaced apart from each other, and spaced apart from the first pair of electrodes; and forming the nanowire between two electrodes of each pair while measuring a current flowing between the two electrodes of each pair, and cutting power applied between the two electrodes of each pair when the current measured is a given value.

6. The method of claim 5, wherein at least one more first pair of electrodes, at least one more second pair of electrodes, and at least one more nanowire connecting the electrodes of each pair are formed.

7. The method of claim 5, wherein the nanowire is formed by a composite electric field, and the measuring of the current and cutting of the power are performed by a system including a switching logic and a current monitor.

8. The method of claim 7, wherein the system is a complementary metal-oxide semiconductor (CMOS) logic.

9. The method of claim 1, wherein the measured current reaches the given value when the nanowire contacts the dummy electrode.

* * * * *